United States Patent
Rosener et al.

(10) Patent No.: US 9,479,857 B2
(45) Date of Patent: Oct. 25, 2016

(54) FLOATING PLATE CAPACITIVE SENSOR

(75) Inventors: Douglas K. Rosener, Santa Cruz, CA (US); Barry J. Lee, Santa Cruz, CA (US)

(73) Assignee: Plantronics, Inc., Santa Cruz, CA (US)

( * ) Notice: Subject to any disclaimer, the term of this patent is extended or adjusted under 35 U.S.C. 154(b) by 2033 days.

(21) Appl. No.: 12/695,486

(22) Filed: Jan. 28, 2010

(65) Prior Publication Data

US 2011/0182458 A1    Jul. 28, 2011

(51) Int. Cl.
*H04R 1/10* (2006.01)
*G06K 9/00* (2006.01)
*H03K 17/96* (2006.01)

(52) U.S. Cl.
CPC ........... *H04R 1/1041* (2013.01); *G06K 9/0002* (2013.01); *H03K 17/962* (2013.01); *H03K 2217/96077* (2013.01)

(58) Field of Classification Search
CPC .... H04R 1/10; H04R 1/1008; H04R 1/1041; H04R 2460/03; H04R 2225/61; H04R 5/033; H04R 25/02; H04R 25/65; H03K 17/962; H03K 2217/96077; H03K 2217/960745
USPC .................. 381/370, 384, 74, 312; 345/174; 327/517; 324/658, 679, 686
See application file for complete search history.

(56) References Cited

U.S. PATENT DOCUMENTS

| | | |
|---|---|---|
| 4,330,690 A | 5/1982 | Botros |
| 2002/0021278 A1 | 2/2002 | Hinckley et al. |
| 2002/0068537 A1 | 6/2002 | Shim et al. |
| 2004/0105538 A1 | 6/2004 | Goebel |
| 2005/0001633 A1* | 1/2005 | Okushima et al. ........... 324/658 |
| 2007/0076897 A1 | 4/2007 | Philipp |
| 2007/0121959 A1* | 5/2007 | Philipp .......................... 381/74 |
| 2011/0007908 A1 | 1/2011 | Rosener et al. |

FOREIGN PATENT DOCUMENTS

| | | |
|---|---|---|
| EP | 0564164 A1 | 10/1993 |
| GB | 2357400 | 12/1999 |

* cited by examiner

*Primary Examiner* — Matthew Eason
(74) *Attorney, Agent, or Firm* — Chuang Intellectual Property Law

(57) ABSTRACT

Methods and apparatuses for capacitive sensing are disclosed. In one example, a capacitive sensor includes a floating sense electrode disposed within proximity of an outward facing surface adapted to be brought in proximity to or touch a user skin surface. An interior electrode is disposed in proximity to the floating sense electrode, where the interior electrode and floating sense electrode form a capacitor.

18 Claims, 9 Drawing Sheets

FLOATING PLATE CAPACITIVE SENSOR

BACKGROUND OF THE INVENTION

Capacitive sensors can be used to detect position or proximity, and are often used in two-dimensional touchpads, touch displays, slide controls, and other types of input interfaces. These input interfaces are commonly utilized by mobile phones, computers, personal digital assistants, and other electronic devices. A device user operates such an electronic device by moving one or more fingers in proximity to or in contact with a sensing region of one or more capacitive sensors at the input interface.

Capacitive touch sensors operate by monitoring the change in capacitance above a parasitic capacitance background when a conductor such as the user finger comes in close proximity to or in contact with a sense electrode. The electrode may be exposed for direct contact or insulated with an insulating material over the sense electrode. In one typical configuration, if touched directly the capacitance added above parasitic capacitance is a body-PCB capacitance between the user finger (and/or body attached to the finger) and a printed circuit board (PCB) to which the sense electrode is attached via a sensing chip. The sense electrode is directly coupled to the sensing chip. Direct contact with the electrode offers the advantage of providing the largest signal, but can provide an electrostatic discharge (ESD) path into the electronics of the device in which the capacitive touch sensor is used.

If there is an insulator above the sense electrode which the user finger contacts, the increase in capacitance is due to the series combination of a body-electrode capacitance between the user finger and the sense electrode and the body-PCB capacitance. The body-PCB capacitance is usually very large so that the dominant increase in capacitance is due to the body-electrode capacitance.

Current capacitive sensors often have limitations with respect to accuracy, flexibility in placement, and use. As a result, improved apparatuses and methods for capacitive sensing are needed.

BRIEF DESCRIPTION OF THE DRAWINGS

The present invention will be readily understood by the following detailed description in conjunction with the accompanying drawings, wherein like reference numerals designate like structural elements.

DESCRIPTION OF SPECIFIC EMBODIMENTS

Figure 1A:
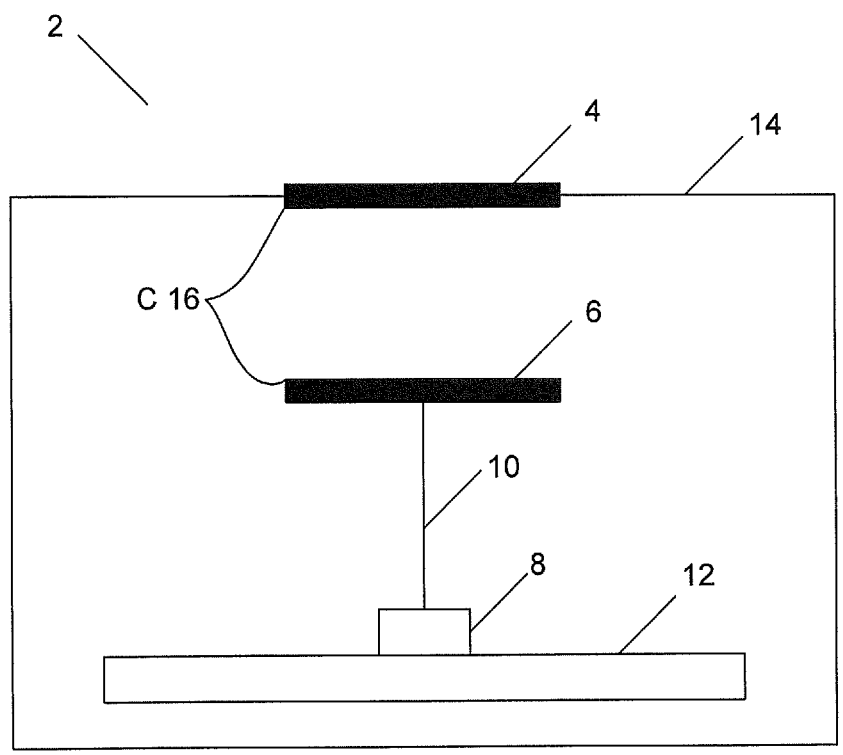
FIG. 1A illustrates a floating electrode capacitive sensor in one example.

Methods and apparatuses for capacitive sensing are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

A capacitive touch sensor is described which, for example, may be used in device user interfaces for touch control as well as for donned and doffed sensing. The inventors have recognized that in certain applications of capacitive touch sensors, a problem arises in placing a sense electrode near where contact with the user is desired. One method involves plating the inside of the device housing at the desired contact point with metal to form the sense electrode. However, difficulties arise in connecting the conformal metallized surface to the device sensing circuitry. In the prior art, a sensor circuit or chip on the main device PCB directly couples to the metallized surface using a connector such as a spring, soldered wire, or conductive adhesive. In general, these solutions may pose reliability issues and in some cases are not feasible or difficult to implement for a given device design. Furthermore, if the electrode is to be placed on a moving joint, then an electrical contact is required that can accommodate the movement. Conductors that twist or spring contacts are often utilized, but these contacts can be a point of mechanical failure and requires additional cost.

In one example of the invention, the previously direct coupled sense electrode is decoupled from the sensing chip and PCB and thereby made "floating", and a secondary capacitive surface is used to capacitively couple the sense electrode to the sensing chip. In one example, the secondary capacitive surface is a metal material (also referred to herein as an interior electrode) such as a metal plate directly coupled to the sensing chip. An additional interior capacitance between the floating sense electrode and directly coupled metal plate appears in series with the body-PCB capacitance and body-floating sense electrode capacitance. Similar to the body-PCB capacitance, the secondary interior capacitance can often be made on the order of the variation capacitance or larger and would therefore have relatively little effect on the sensitivity of the floating sense electrode.

As a result, the floating sense electrode does not have to be physically connected to the PCB, either directly or via a sensor chip. This provides additional ESD protection. It also means that mechanical contacts to the sense electrode do not have to be used, thereby increasing reliability. Furthermore, in some cases it allows for larger sense electrodes, because now there is less restriction on where the sense electrodes can be placed.

If the body-PCB capacitance is much larger than the interior capacitance between the floating sense electrode and metal plate, and the floating sense electrode is directly contacted by the user or has only a weakly conducting material cover, the result is a variation capacitance that is consistently equal to the floating sense electrode-metal plate interior capacitance. This provides for a more reliable sensing system as the signal level is always the same amount above a baseline level when the user contacts the floating sense electrode.

In a headset application, the capacitive sensing system thereby advantageously increases the reliability of DON/DOFF signal sensing and reduces ESD susceptibility. In certain applications, the capacitive sensing system makes previously difficult or infeasible electrode placement within the device possible.

In one example, a capacitive sensor includes a decoupled sense electrode disposed within proximity of an outward facing surface adapted to be brought in proximity to or touch a user skin surface, where a first capacitance is formed when the decoupled sense electrode is brought in proximity to the user skin surface. The capacitive sensor includes a coupled interior electrode disposed in proximity to the decoupled sense electrode, where the coupled interior electrode and decoupled sense electrode form a capacitor having a second capacitance. The capacitive sensor further includes a sense circuit coupled to the coupled interior electrode, where the sense circuit is adapted to determine whether the decoupled sense electrode is in proximity to or touching a user skin surface.

In one example, a capacitive sensor includes a decoupled electrically conductive material disposed within proximity of a surface adapted to be brought in proximity to or touch a user skin surface. The capacitive sensor includes a coupled electrically conductive material, where the coupled electrically conductive material and decoupled electrically conductive material form a capacitor having an internal capacitance. The capacitive sensor further includes a sense circuit coupled to the coupled electrically conductive material, the sense circuit adapted to determine whether the decoupled electrically conductive material is in proximity to or touching a user skin surface responsive to a measured capacitance determined by the internal capacitance and a sense capacitance between a user skin surface and the decoupled electrically conductive material.

In one example, a capacitive sensor includes a floating sense electrode disposed within proximity of an outward facing surface adapted to be brought in proximity to or touch a user skin surface. An interior electrode is disposed in proximity to the floating sense electrode, where the interior electrode and floating sense electrode form a capacitor having a capacitance. The interior electrode is adapted to be directly coupled to a sense circuit configured to determine whether the floating sense electrode is in proximity to or touching a user skin surface.

In one example implementation, a capacitive touch sensor is used in a headset to determine whether a headset is currently being worn ("donned") or not worn ("doffed" or "undonned") on the ear of a user. The ability to determine whether a headset is donned or doffed is useful in a variety of contexts. For example, whether a user's headset is donned or doffed may indicate the user's ability or willingness to communicate, often referred to as user "presence". User presence is increasingly important as the methods, devices, and networks by which people may communicate, at any given time or location, proliferate. The determination of whether a user's headset is donned or doffed is also useful in a variety of other contexts in addition to presence.

In one example, a headset includes a decoupled electrically conductive material disposed within proximity of a headset surface adapted to be brought in contact with a user ear, where a first capacitance is formed when the headset surface is brought in contact with the user ear. The headset includes a coupled electrically conductive material disposed in proximity to the decoupled electrically conductive material, where the coupled electrically conductive material and decoupled electrically conductive material forming a capacitor having a second capacitance in series with the first capacitance. The headset further includes a processor coupled to the coupled electrically conductive material adapted to receive signals from the coupled electrically conductive material to determine a measured capacitance associated with the first capacitance and the second capacitance indicating a headset donned state or a headset doffed state.

FIG. 1A illustrates a capacitive sensor 2 having a floating sense electrode 4 in one example. The capacitive sensor 2 includes a floating sense electrode 4 disposed within proximity of an outward facing surface of a housing 14 adapted to be brought in proximity to or touch a user skin surface. In various examples, the floating sense electrode 4 may be on the exterior of housing 14, and interior of housing 14, or anywhere in proximity of the housing 14 to which contact or proximity to the user is to be made. The capacitive sensor 2 includes a direct coupled interior electrode 6 disposed in proximity to the floating sense electrode 4. The coupled interior electrode 6 and floating sense electrode 4 form a capacitor having an internal capacitance C 16.

The capacitive sensor 2 further includes a sensor chip 8 direct coupled to the coupled interior electrode 6 via a connector 10. For example, connector 10 may be a wire connector. The coupled interior electrode 6 is driven by signal from the sensor chip 8. The sensor chip 8 is adapted to determine whether the floating sense electrode 4 is in proximity to or touching a user skin surface. The sensor chip 8 is disposed on a printed circuit board (PCB) 12.

As shown in FIG. 1A, floating sense electrode 4 is decoupled from both sensor chip 8 and PCB 12 in that it is not directly coupled using a wire or other means to either sensor chip 8 or PCB 12 and can be described as "floating". Internal capacitance C 16 between the floating sense electrode and the interior electrode may be regarded as extending the touch sense circuit of the sensor chip 8 and coupled interior electrode 6 to floating sense electrode 4. The additional internal capacitance C 16 has been inserted into the circuit as a result of the addition of floating sense electrode 4. Advantageously, the floating sense electrode 4 functions by capacitive coupling to the circuit, and specifically to the direct coupled interior electrode 6.

Floating sense electrode 4 and coupled interior electrode 6 are formed from an electrically conductive material, such as copper. The floating sense electrode 4 may be formed by plating the electrically conductive material onto an interior or exterior surface of housing 14, or by attaching an electrically conductive material within the housing 14. Advantageously, there is no need to form a direct electrical connection to the plated electrically conductive material. The plated electrically conductive material need not have a specific form factor, and may take the shape of the housing surface on which it is formed, including a curved surface. In the example shown in FIG. 1B, the floating sense electrode 4 is disposed on the outward facing surface of housing 14, the floating sense electrode 4 configured to contact the user skin surface. In a further example shown in FIG. 1C, the outward facing surface of housing 14 includes an insulating material 15 disposed over the floating sense electrode 4, the insulating material 15 configured to contact the user skin surface. In a further example shown in FIG. 1D, a second floating sense electrode 17 is utilized in conjunction with floating sense electrode 4. An insulating material 19 is located between second floating sense electrode 17 and floating sense electrode 4. Second floating sense electrode 17 and floating sense electrode 4 form an additional capacitor having a capacitance C 21. For example, such a configuration may be useful when removable parts are needed between the housing and an innermost electrode. An example of this configuration is shown in FIG. 1E, where a removable part 23 includes the floating sense electrode 4. In the example shown in FIG. 1E, floating sense electrode 4 is formed from two stacked layers of conducting material, the layers coupled with a conducting material. In further variations, additional floating sense electrodes may be added to form a stacked configuration.

Figure 2:
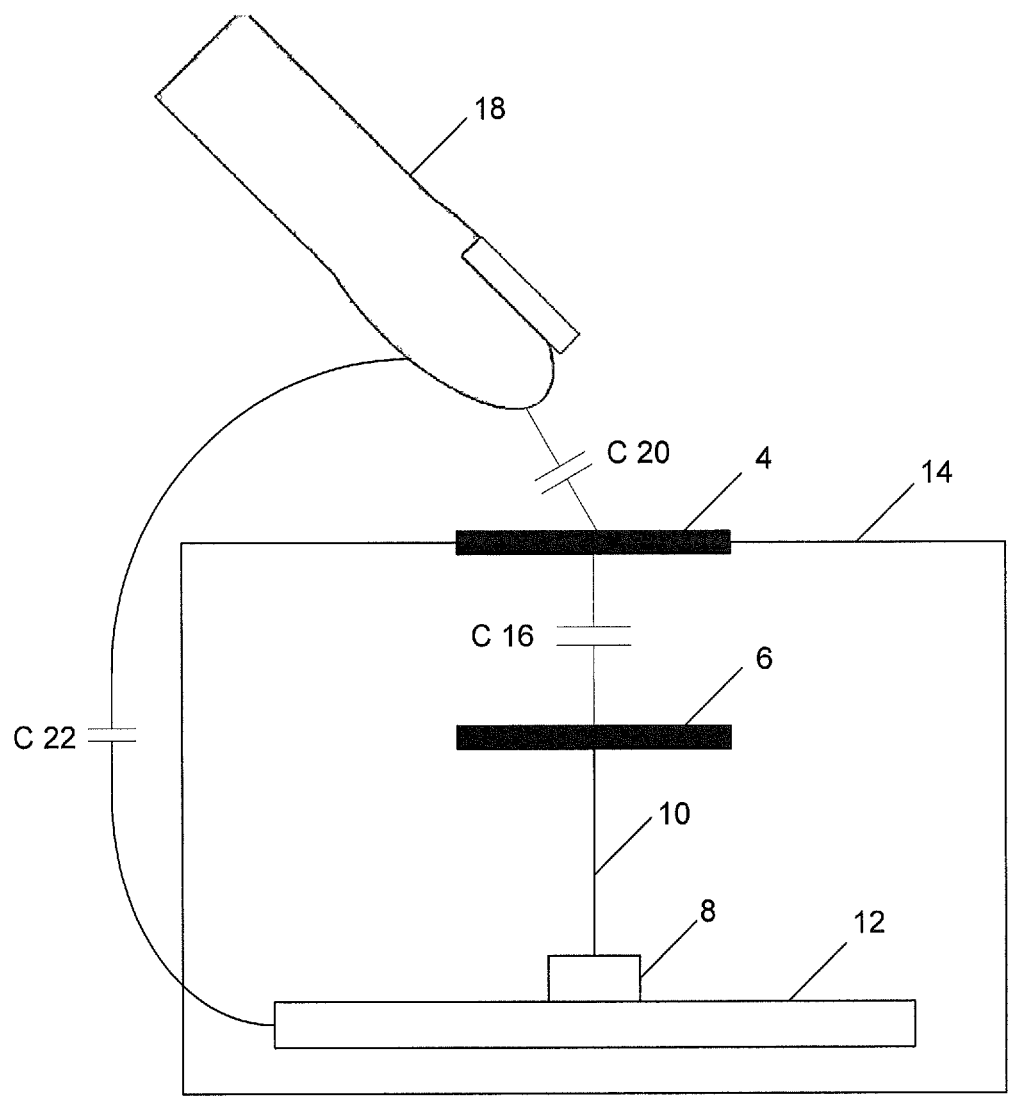
FIG. 2 illustrates the floating electrode capacitive sensor in operation in one example.

FIG. 2 illustrates the capacitive sensor 2 in operation in one example. In the example shown in FIG. 2, the capacitive sensor 2 is implemented as part of a user interface, such as a touch pad, whereby a user finger 18 brought in proximity to or in contact with the capacitive sensor 2 to indicate a user interface input action. Although a user finger 18 is described in this example, skin at any user part may be utilized.

When the user finger 18 is brought in proximity to or in contact with the floating sense electrode 4, a sense capacitance C 20 is formed between the user skin surface and the floating sense electrode 4. A PCB capacitance C 22 is formed between the user skin surface and PCB 12. The user skin surface is a conductor, and where the user finger 18 is brought in proximity to the floating sense electrode 4 but not in contact with, the air gap there between results in a sense capacitance C 20 which increases as the user finger 18 is brought closer to the floating sense electrode 4 and the air gap decreases. As described previously in reference to FIG. 1A, the coupled interior electrode 6 and floating sense electrode 4 form a capacitor having an internal capacitance C 16.

The capacitance C 20 between the user finger and the floating sense electrode 4, the capacitance C 16 between the floating electrode and the interior electrode, and the PCB capacitance C 22 between the user finger and the PCB are all in series. In a simplified model where parasitic capacitance has been calibrated for, the total measured capacitance $C_T$ can be written as:

$$1/C_T = 1/C_{20} + 1/C_{16} + 1/C_{22}$$

In the above formula, C 22 is typically very large relative to C 16 and can be discarded, so the equation can be simplified to:

$$1/C_T = 1/C_{20} + 1/C_{16}$$

In operation, the significant measurable change in capacitance is between the user finger 18 and the floating sense electrode 4. Three states of operation may be utilized:

(1) The user finger 18 is very far from the floating electrode

When the user finger 18 is far from the floating electrode, C 20 approximates zero, and thus $1/C_{20}$ is very large, resulting in $C_T=0$. In this state, the sensor chip 8 will measure the parasitic capacitance in the circuit or measure approximately zero if the parasitic capacitance has been calibrated for.

(2) The user finger 18 is in close proximity to the floating electrode, but not in direct contact When the user skin surface is brought in proximity to the floating sense electrode 4, the sensor chip 8 measures a capacitance dependent upon the series combination of sense capacitance C 20 and the internal capacitance C 16. The sense capacitance C 20 and internal capacitance C 16 dominate, and will be measured by the sensor chip 8: $1/C_T = 1/C_{20} + 1/C_{16}$ (3) The user finger 18 directly contacts the floating sense electrode 4

When the user finger 18 is in direct contact with the floating sense electrode 4, the sensor chip 8 measures a capacitance approximately equal to the internal capacitance C 16. When the user finger 18 contacts the floating sense electrode 4, C 20 become very large, and thus $1/C_{20}$ approaches zero, resulting in: $C_T=C$ 16. The sensor chip 8 thus reads the internal capacitance C 16 between the floating sense electrode 4 and the coupled interior electrode 6. Advantageously, the capacitance measurement is the same each time the user contacts the floating sense electrode 4 since it is not dependent on a body-PCB capacitance measurement as in the prior art.

Figure 1B:
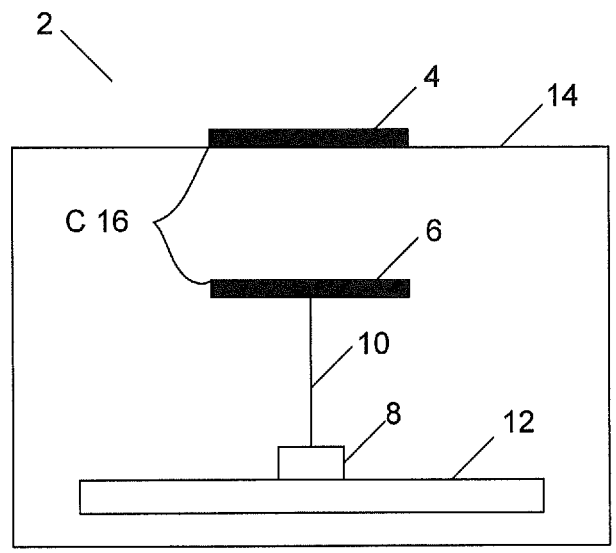
FIG. 1B illustrates a floating electrode capacitive sensor in one example.
Figure 1C:
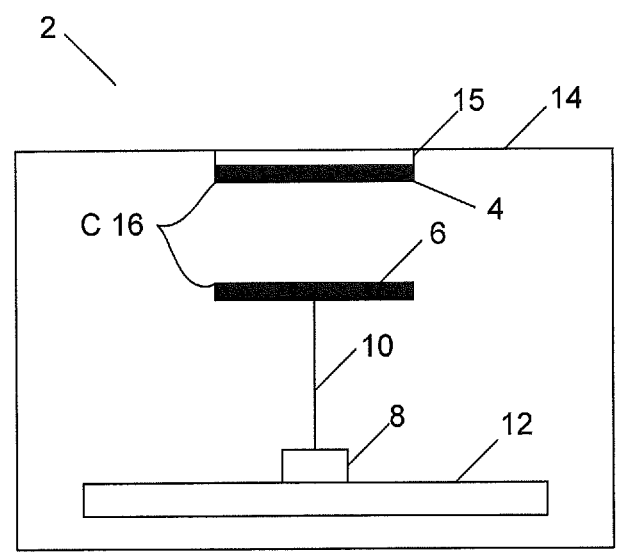
FIG. 1C illustrates a floating electrode capacitive sensor in one example.
Figure 1D:
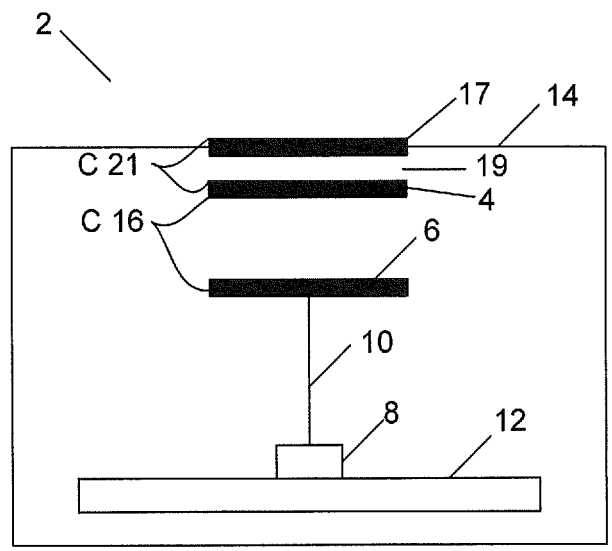
FIG. 1D illustrates a floating electrode capacitive sensor in a further example.
Figure 1E:
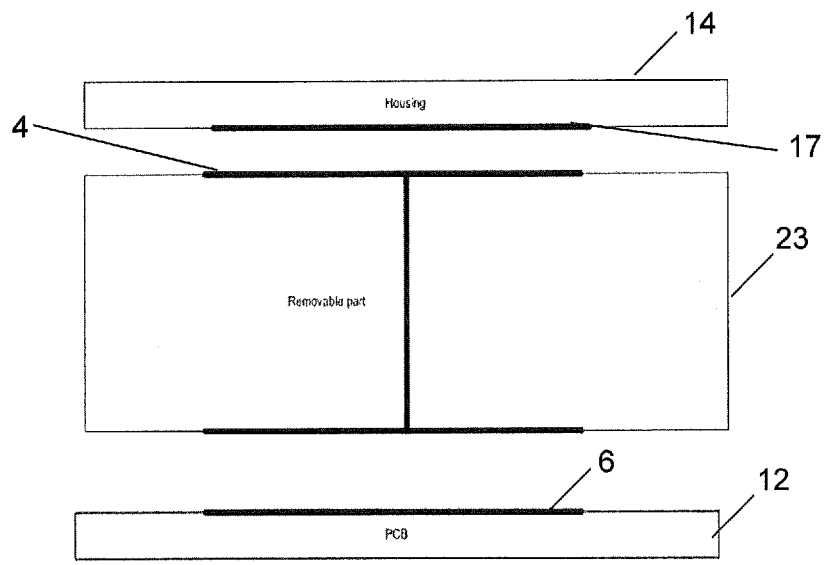
FIG. 1E illustrates a floating electrode capacitive sensor in a further example.

In the example shown in FIG. 1B where the floating sense electrode 4 includes an overlaying insulating material 15, when the user finger 18 contacts the insulating material 15, the sensor chip 8 measures the series combination of the internal capacitance C 16 and the sense capacitance C 20 similar to case (2) above when the user finger 18 is brought in proximity to floating sense electrode 4.

Figure 3:
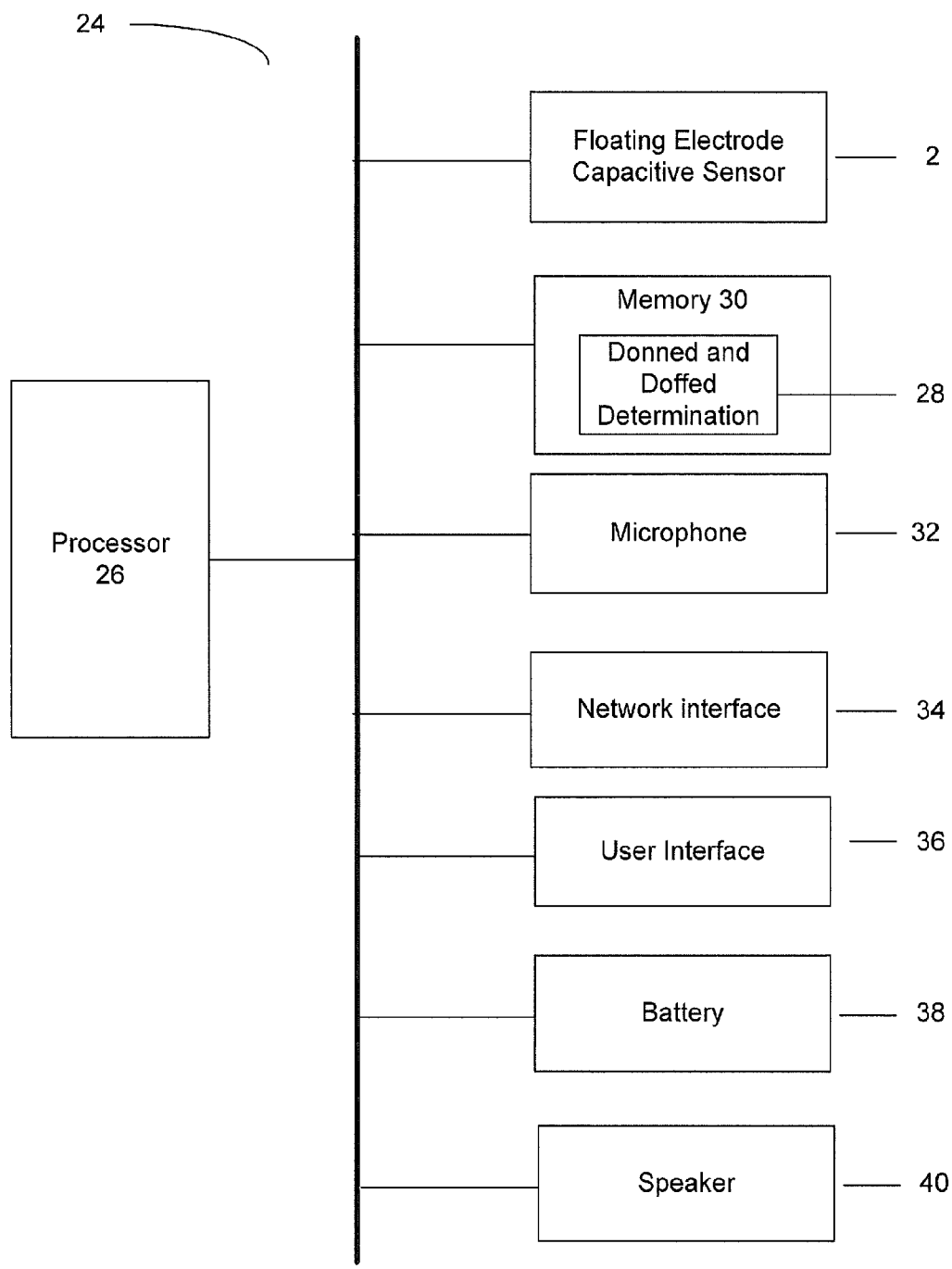
FIG. 3 illustrates a block diagram of a headset utilizing the floating electrode capacitive sensor shown in FIG. 1.

FIG. 3 illustrates a block diagram of a headset 24 utilizing the capacitive sensor 2 shown in FIG. 1A. Headset 24 includes a processor 26 operably coupled to a capacitive sensor 2, a memory 30, a microphone 32, a network interface 34, user interface 36, battery 38, and a speaker 40. In one example implementation, certain components of capacitive sensor 2 shown in FIG. 1A are integrated with components at headset 24. For example, sensor chip 8 and PCB 12 may be integrated with processor 26 and a headset PCB, respectively.

Processor 26 controls the operation of the headset 24 and allows for processing data, and in particular managing data between capacitive sensor 2 and memory 30 for determining the donned or doffed state of headset 24. In one example, processor 26 is a high performance, highly integrated, and highly flexible system-on-chip (SOC). Processor 26 may include a variety of separate or integrated processors (e.g., digital signal processors), with conventional CPUs being applicable, and controls the operation of the headset 24 by executing programs in memory 30.

Memory 30 may include a variety of memories, and in one example includes SDRAM, ROM, flash memory, or a combination thereof. Memory 30 may further include separate memory structures or a single integrated memory structure. In one example, memory 30 may be used to store passwords, network and telecommunications programs, and/or an operating system (OS). In one embodiment, memory 30 stores a donned and doffed determination module 28 which processes data from capacitive sensor 2 to identify a headset donned state or headset doffed state. Memory 30 may also store signals or data from capacitive sensor 2.

In one example, network interface 34 includes a transceiver for communicating with a wireless local area network (LAN) radio transceiver (e.g., wireless fidelity (WiFi), Bluetooth, ultra wideband (UWB) radio, etc.) for access to a network, or an adaptor for providing wired communications to a network. In one example, network interface 34 is adapted to derive a network address for the headset using the headset's electronic serial number, which is used to identify the headset on the network. The network interface 34 may communicate using any of various protocols known in the art for wireless or wired connectivity.

User interface 36 allows for communication between a headset user and the headset 24, and in one example includes an audio and/or visual interface such that a prompt may be provided to the user's ear and/or an LED may be lit. For example, an audio interface may be initiated by the headset upon detection that the headset is donned. In addition, the audio interface can provide feedback to the user in the form of an audio prompt (e.g., a tone or voice) through the speaker 40 indicating the headset 24 is in place (i.e., "donned").

Figure 4:
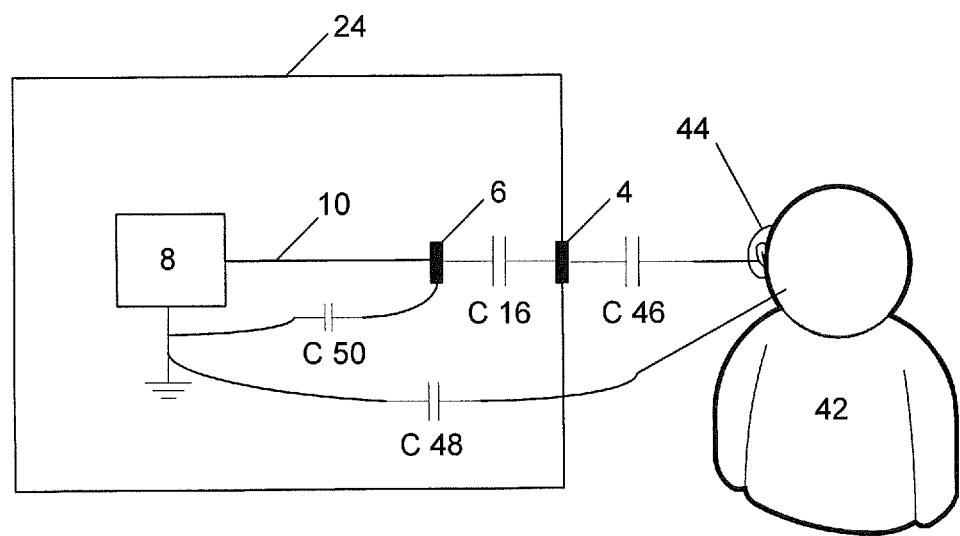
FIG. 4 is a schematic illustration of a headset having a capacitive touch sensing system utilizing a floating electrode capacitive sensor.

FIG. 4 is a schematic illustration of a headset 24 having a capacitive touch sensing system utilizing a capacitive sensor 2 in operation. In one example, the doffed or donned state of the headset 24 is determined based on whether the floating sense electrode 4 is touching or in close proximity to the user ear. If the floating sense electrode 4 is touching the user's ear or in close proximity to the user's ear, the headset is determined to be donned.

In donning the headset 24, a headset user 42 brings a headset surface in contact with a headset user's ear 44 so that the headset 24 is supported by the headset user's ear. A capacitance C 46 is formed with floating sense electrode 4 when the headset surface is brought in contact with the user ear 44, where the user's ear can be considered the opposing plate of a capacitor with the capacitance C 46. The floating sense electrode 4 is formed in part of electrically conductive material as described previously. The floating sense electrode 4 can either contact the user's ear or be sufficiently close to the user's ear to permit detection of capacitance C 46.

The headset 24 includes a coupled interior electrode 6 disposed in proximity to the floating sense electrode 4, where the coupled interior electrode 6 and decoupled electrode form a capacitor having a capacitance C 16 in series with the capacitance C 46.

The capacitance C 16 remains fixed and does not vary based on whether the user ear 44 is in proximity to or touching the floating sense electrode 4. In contrast, the capacitance C 46 between the floating sense electrode 4 and the user ear 44 varies as the headset is brought in proximity to the ear 44. The distance and material between the floating sense electrode 4 and interior electrode 6 may vary based on the particular implementation.

Advantageously, the floating sense electrode 4 can be manufactured and placed as close to the headset housing surface as possible. For example, electrically conductive material may be deposited onto the interior surface of the housing without the need to form a wire connection to the electrically conductive material, where the electrically conductive material forms the floating sense electrode 4. Thus, problems related to wired connections such as soldering and space limitations are eliminated. Furthermore, the electrically conductive material forming the floating sense electrode 4 may be placed on the outer surface of the housing, since no wired connection is required to any internal components inside the housing. In this example, the headset housing need not be modified to accommodate the capacitive sensor.

Alternatively, a portion of the headset housing itself or headset component is composed of electrically conductive material which serves as the floating sense electrode 4. The floating sense electrode 4 can either be a touch electrode or a proximity electrode.

Furthermore, the electrically conductive material forming the floating sense electrode 4 need not be parallel to the coupled interior electrode 6, thereby providing flexibility in manufacturing. For example, the electrically conductive material may be formed on a curved surface of the headset housing.

A touch sensing system including a sensor chip 8 is connected to the coupled interior electrode 6, and the touch sensing system determines whether the floating sense electrode 4 is touching or in close proximity to the user's ear 44 based on a measured capacitance dependent upon both capacitance C 46 and capacitance C 16. When floating sense electrode 4 is touching or in close proximity to the skin of the user's ear 44, an increase in relative capacitance is detected.

It should be understood that the sensor chip 8 and touch sensing system can be located on a printed circuit board (PCB), and there is parasitic capacitance between the coupled interior electrode 6 and the PCB ground plane which is schematically illustrated as parasitic capacitance C 50. Capacitance C 48 indicates the capacitance between the PCB ground plane and the headset user 42.

Thus, assuming that parasitic capacitance C 50 is negligible or calibrated for, the total capacitance seen by the sensor chip 8 is the series capacitance C 46, capacitance C 16, and capacitance C 48. Operation is substantially similar to that described above in reference to FIG. 2. The capacitive connection of the user to the system ground capacitance C 48 is usually a factor of 10 or more greater than the capacitance C 46 and the capacitance C 16, so that capacitance C 46 and capacitance C 16 dominate. In one example capacitance C 16, and therefore the sensitivity of the sensor, is maximized by conforming the parallel relationship and size of floating sense electrode 4 and coupled interior electrode 6. Means which can be used for determining the capacitance measured are known and will therefore not be discussed in detail herein. For example the single-slope method or the dual slope method can be used. The single slope method involves driving the electrode with a DC current source and measuring the time for the capacitance to reach a reference level. Use of capacitive touch sensing systems is also discussed in the commonly assigned and co-pending U.S. patent application Ser. No. 12/060,031 entitled "User Authentication System and Method"which was filed on Mar. 31, 2008 , which is hereby incorporated into this disclosure in its entirety by reference.

Figure 5A:
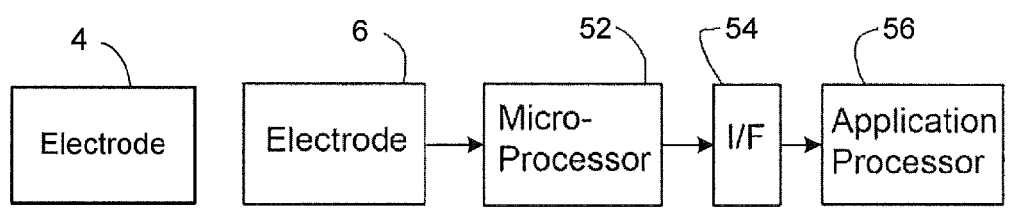
FIG. 5A is a block diagram illustrating an architecture of the system for capacitive touch sensing.

In FIG. 5A there is a block diagram illustrating an architecture of a system for capacitive touch sensing. The system includes the floating sense electrode 4 and the coupled interior electrode 6, a microprocessor 52 to receive signals from the coupled interior electrode 6 and which includes interface firmware and touch sensing firmware to acquire and analyze the measured capacitance of the floating sense electrode 4. The system also includes an interface 54 which can be in the form of hardware or software and an application processor 56.

Figure 5B:
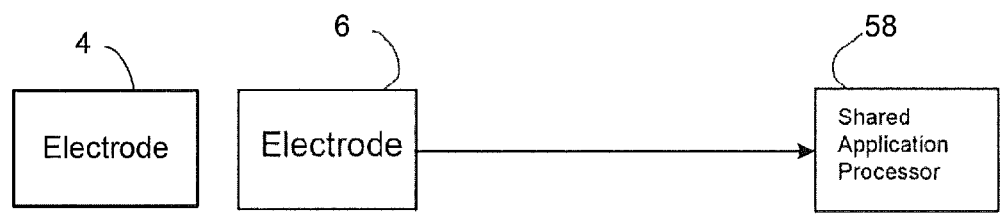
FIG. 5B illustrates an alternative architecture of the system for capacitive touch sensing.

FIG. 5B illustrates an alternative architecture of the system for capacitive touch sensing which is included as part of a system providing other functions of a computer. In the architecture shown in FIG. 5B, system signals from the floating sense electrode 4 are transmitted via coupled interior electrode 6 to a shared application processor 58 which includes application firmware and touch sensing firmware to perform the necessary calculations. In one example, the shared application processor 58 coupled to the coupled interior electrode 6 is adapted to receive signals from the coupled interior electrode 6 to determine a measured capacitance associated with a capacitance at floating sense electrode 4 and the capacitance at interior electrode 6 indicating a headset donned state or a headset doffed state. The measured capacitance is approximately the capacitance between the floating sense electrode 4 and the coupled electrode 6 when the headset is in a donned state.

Figure 6:
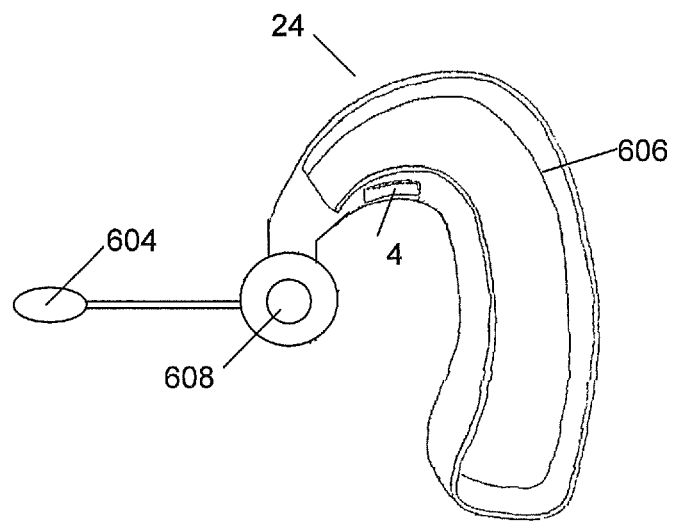
FIG. 6 illustrates an example form factor of a headset utilizing a floating electrode capacitive sensor.

FIG. 6 illustrates an example form factor of a headset 24 utilizing a capacitive sensor 2, whereby the headset 24 has the capability to determine whether it is doffed or donned. Some of the components of the headset 24 are conventional and will not be discussed in detail. The headset 24 includes a microphone 604, speaker 608, and housing 606. In the example illustrated in FIG. 6, capacitive sensor 2 is disposed somewhere along an inner spine of the headset housing 606 so that floating sense electrode 4 of capacitive sensor 2 is in proximity to the user ear skin when the headset 24 is worn. Capacitive sensor 2 operates as described above to measure a capacitance associated with whether the headset 24 is in proximity to the user skin.

In one example, the headset housing 606 includes an insulating material disposed over the floating sense electrode 4, the insulating material configured to contact the user ear when the headset is in a donned state. In a further example, the floating sense electrode 4 is disposed on an outer headset surface of the housing 606, the floating sense electrode 4 configured to contact the user ear when the headset 24 is in a donned state.

Figure 7:
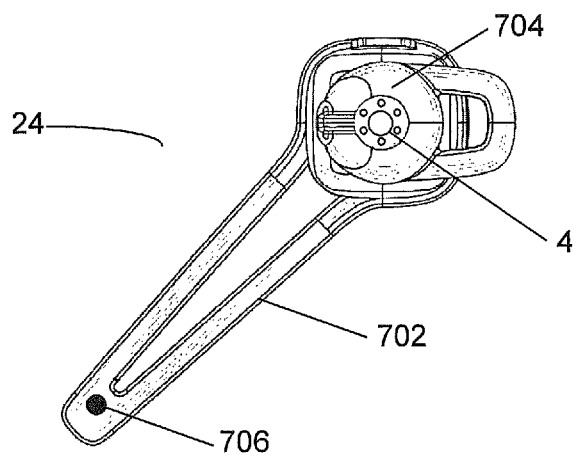
FIG. 7 illustrates a further example form factor of a headset utilizing a floating electrode capacitive sensor.

FIG. 7 illustrates a further example form factor of a headset 24 utilizing a capacitive sensor 2, whereby the headset 24 has the capability to determine whether it is doffed or donned. The headset 24 includes a body 702, a microphone 706, and an optional ear cushion 704 covering a portion of a speaker. Optional ear cushion 704 may, for example, be composed of a soft flexible material such as rubber to conform to the user ear when headset 24 is donned.

In the example illustrated in FIG. 7, floating sense electrode 4 is disposed at a headset speaker so that the floating sense electrode 4 is in proximity to the user ear when the speaker is inserted into the user ear. Capacitive sensor 2 operates as described above to measure a capacitance associated with whether the headset is in proximity to the user ear.

Figure 8:
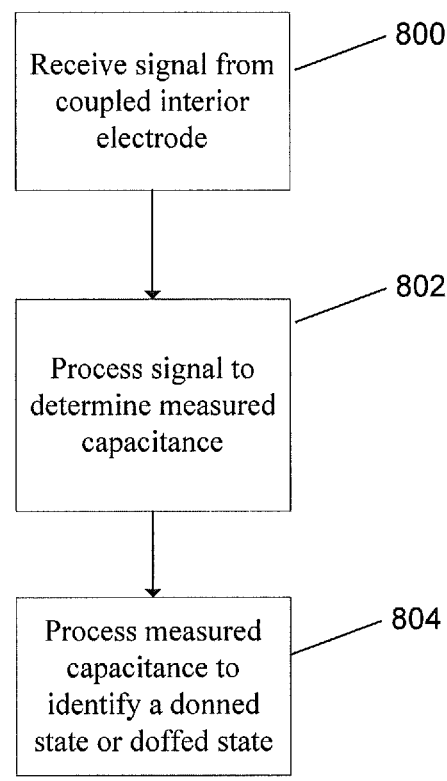
FIG. 8 is a flow diagram illustrating a process for identifying a donned state or doffed state of a headset utilizing a floating electrode capacitive sensor.

FIG. 8 is a flow diagram illustrating a process for identifying a donned state or doffed state of a headset utilizing a floating electrode capacitive sensor. At block 800, a signal is received from a direct coupled interior electrode, the signal including a component from a decoupled electrode disposed in proximity to both the internal direct coupled electrode and an outer surface of the headset housing. At block 802, the signal is processed to determine a measured capacitance. At block 804, the measured capacitance is processed to determine a headset donned state or a headset doffed state.

While the exemplary embodiments of the present invention are described and illustrated herein, it will be appreciated that they are merely illustrative and that modifications can be made to these embodiments without departing from the spirit and scope of the invention. For example, the capacitive sensor described herein may be embodied in other mobile devices in addition to headsets. Although certain examples describe simplified models of operation, in further examples other models and manners of operation may be employed. Thus, the scope of the invention is intended to be defined only in terms of the following claims as may be amended, with each claim being expressly incorporated into this Description of Specific Embodiments as an embodiment of the invention.

What is claimed is:

1. A headset comprising:
    a decoupled electrically conductive material disposed within proximity of a headset surface adapted to be brought in contact with a user ear, wherein a first capacitance is formed when the headset surface is brought in contact with the user ear, wherein the headset surface comprises an insulating material disposed over the decoupled electrically conductive material, the insulating material configured to contact the user ear when the headset is in a donned state;
    a coupled electrically conductive material disposed in proximity to the decoupled electrically conductive material, the coupled electrically conductive material and decoupled electrically conductive material forming a capacitor having a second capacitance in series with the first capacitance; and
    a processor coupled to the coupled electrically conductive material adapted to receive signals from the coupled electrically conductive material to determine a measured capacitance associated with the first capacitance and the second capacitance indicating a headset donned state or a headset doffed state.

2. The headset of claim 1, wherein the decoupled electrically conductive material is disposed at a headset earpiece.

3. The headset of claim 1, wherein the decoupled electrically conductive material is disposed at a spine portion of a headset housing.

4. The headset of claim 1, wherein the decoupled electrically conductive material is copper.

5. The headset of claim 1, wherein the measured capacitance is approximately the second capacitance when the headset is in a donned state.

6. A capacitive sensor comprising:
    a decoupled sense electrode disposed within proximity of an outward facing surface adapted to be brought in proximity to or touch a user skin surface, wherein a first capacitance is formed when the decoupled sense electrode is brought in proximity to the user skin surface, wherein the outward facing surface comprises an insulating material disposed over the decoupled sense electrode, the insulating material configured to contact the user skin surface;
    a coupled interior electrode disposed in proximity to the decoupled sense electrode, the coupled interior electrode and decoupled sense electrode forming a capacitor having a second capacitance; and
    a sense circuit coupled to the coupled interior electrode, the sense circuit adapted to determine whether the decoupled sense electrode is in proximity to or touching the user skin surface.

7. The capacitive sensor of claim 6, wherein the sense circuit measures a capacitance approximately equal to the second capacitance when the decoupled sense electrode is touching the user skin surface.

8. The capacitive sensor of claim 6, wherein the decoupled sense electrode comprises an electrically conductive material.

9. The capacitive sensor of claim 6, wherein the sense circuit measures a capacitance dependent upon the first capacitance and the second capacitance.

10. A capacitive sensor comprising:
    a decoupled electrically conductive material disposed within proximity of a surface adapted to be brought in proximity to or touch a user skin surface, wherein the surface comprises an insulating material disposed over the decoupled electrically conductive material, the insulating material configured to contact the user skin surface;

a coupled electrically conductive material, the coupled electrically conductive material and decoupled electrically conductive material forming a capacitor having an internal capacitance; and a sense circuit coupled to the coupled electrically conductive material, the sense circuit adapted to determine whether the decoupled electrically conductive material is in proximity to or touching the user skin surface responsive to a measured capacitance determined by the internal capacitance and a sense capacitance between the user skin surface and the decoupled electrically conductive material.

11. The capacitive sensor of claim 10, wherein the sense circuit measures a capacitance approximately equal to the internal capacitance when the decoupled electrically conductive material is touching the user skin surface.

12. The capacitive sensor of claim 10, wherein the decoupled electrically conductive material is copper.

13. The capacitive sensor of claim 10, wherein the user skin surface is at a user finger brought in proximity to the capacitive sensor to indicate a user interface input action.

14. The capacitive sensor of claim 10, further comprising a printed circuit board, the sense circuit coupled to the printed circuit board, wherein the decoupled electrically conductive material is decoupled from the printed circuit board.

15. A capacitive sensor comprising:

a floating sense electrode disposed within proximity of an outward facing surface adapted to be brought in proximity to or touch a user skin surface;

a second floating sense electrode disposed in proximity to the floating sense electrode, the second floating sense electrode and the floating sense electrode forming a first capacitor having a first capacitance;

an interior electrode disposed in proximity to the second floating sense electrode, wherein the interior electrode and the second floating sense electrode form a second capacitor having a second capacitance, and the interior electrode is adapted to be directly coupled to a sense circuit configured to determine whether the floating sense electrode is in proximity to or touching the user skin surface.

16. The capacitive sensor of claim 15, wherein the floating sense electrode is an electrically conductive material deposited at a headset housing.

17. The capacitive sensor of claim 15, wherein the second floating sense electrode is formed on a removable part disposed beneath a headset housing.

18. The capacitive sensor of claim 15, wherein the second floating sense electrode comprises a first layer of conducting material and a second layer of conducting material in a stacked configuration, the first layer and the second layer coupled with a conducting material.

* * * * *